(12) United States Patent
Zhao et al.

(10) Patent No.: US 8,102,027 B2
(45) Date of Patent: Jan. 24, 2012

(54) IC PACKAGE SACRIFICIAL STRUCTURES FOR CRACK PROPAGATION CONFINEMENT

(75) Inventors: Sam Ziqun Zhao, Irvine, CA (US); Chonghua Zhong, Irvine, CA (US); Rezaur Rahman Khan, Rancho Santa Margarita, CA (US)

(73) Assignee: Broadcom Corporation, Irvine, CA (US)

( * ) Notice: Subject to any disclaimer, the term of this patent is extended or adjusted under 35 U.S.C. 154(b) by 738 days.

(21) Appl. No.: 12/073,450

(22) Filed: Mar. 5, 2008

(65) Prior Publication Data
US 2009/0051010 A1 Feb. 26, 2009

Related U.S. Application Data

(60) Provisional application No. 60/935,606, filed on Aug. 21, 2007.

(51) Int. Cl.
*H01L 23/544* (2006.01)
(52) U.S. Cl. ................... 257/620; 257/E23.179
(58) Field of Classification Search ............ 257/620, 257/E23.179
See application file for complete search history.

(56) References Cited

U.S. PATENT DOCUMENTS

| | | | |
|---|---|---|---|
| 4,610,079 A | 9/1986 | Abe et al. | |
| 5,763,936 A | 6/1998 | Yamaha et al. | |
| 5,834,829 A | 11/1998 | Dinkel et al. | |
| 6,365,958 B1 | 4/2002 | Ibnabdeljalil et al. | |
| 7,041,578 B2 | 5/2006 | Mahle et al. | |
| 7,223,673 B2 * | 5/2007 | Wang et al. | 438/460 |
| 7,453,128 B2 * | 11/2008 | Tsutsue et al. | 257/409 |
| 7,586,175 B2 * | 9/2009 | Lee et al. | 257/620 |
| 7,615,848 B2 * | 11/2009 | Uchikoshi et al. | 257/620 |
| 7,622,364 B2 * | 11/2009 | Adkisson et al. | 438/462 |
| 7,642,624 B2 * | 1/2010 | Wakayama et al. | 257/620 |
| 7,714,413 B2 * | 5/2010 | Morimoto et al. | 257/620 |
| 7,795,705 B2 * | 9/2010 | Tsutsue | 257/620 |
| 2003/0122220 A1 * | 7/2003 | West et al. | 257/620 |
| 2005/0087878 A1 | 4/2005 | Uesugi et al. | |
| 2006/0012012 A1 * | 1/2006 | Wang et al. | 257/620 |
| 2006/0055007 A1 | 3/2006 | Yao et al. | |
| 2006/0073675 A1 | 4/2006 | Yamamura | |
| 2006/0076651 A1 | 4/2006 | Tsutsue | |
| 2006/0163699 A1 * | 7/2006 | Kumakawa et al. | 257/620 |
| 2007/0040242 A1 * | 2/2007 | Sasaki et al. | 257/620 |
| 2007/0194409 A1 * | 8/2007 | Wang et al. | 257/620 |
| 2007/0257371 A1 * | 11/2007 | Wakayama et al. | 257/758 |
| 2008/0023802 A1 * | 1/2008 | Suzuki | 257/620 |

(Continued)

FOREIGN PATENT DOCUMENTS

CN 1770432 A 5/2006
(Continued)

OTHER PUBLICATIONS

English language Abstract of Japanese Patent Publication No. 08-172062 A, Japanese Patent Office, Patent & Utility Model Gazette DB, Patent Abstracts of Japan, (1996).

(Continued)

*Primary Examiner* — Nathan Ha
(74) *Attorney, Agent, or Firm* — Sterne, Kessler, Goldstein & Fox P.L.L.C.

(57) ABSTRACT

Systems and methods for preventing damage to a unit with preventive structures are presented. In an embodiment, a unit of a collection of units includes a functional area and a preventive structure configured to prevent cracks from propagating into the functional area.

32 Claims, 13 Drawing Sheets

U.S. PATENT DOCUMENTS

| | | | |
|---|---|---|---|
| 2008/0122038 A1* | 5/2008 | Inohara | 257/620 |
| 2008/0122039 A1* | 5/2008 | Liu | 257/620 |
| 2008/0157284 A1* | 7/2008 | Chang et al. | 257/620 |
| 2008/0230874 A1* | 9/2008 | Yamada et al. | 257/620 |
| 2009/0065903 A1* | 3/2009 | Tsutsue et al. | 257/620 |
| 2009/0289325 A1* | 11/2009 | Wang et al. | 257/510 |
| 2010/0096732 A1* | 4/2010 | Koubuchi et al. | 257/620 |

FOREIGN PATENT DOCUMENTS

| | | |
|---|---|---|
| JP | 03-171688 A | 7/1991 |
| JP | 08-172062 A | 7/1996 |
| JP | 2007-157858 A | 6/2007 |
| KR | 2004-0104779 A | 12/2004 |
| KR | 2005-0039517 A | 4/2005 |

OTHER PUBLICATIONS

English language Abstract of Korean Patent Publication No. 2004-0104779 A, European Patent Office, espacenet database—Worldwide, (2004).

English language Abstract of Japanese Patent Publication No. 03-171688 A, Japanese Patent Office, Patent & Utility Model Gazette DB, Patent Abstracts of Japan, (2011) (listed as document FP1 on the accompanying form PTO/SB/08A).

English language Abstract of Japanese Patent Publication No. 2007-157858 A, Japanese Patent Office, Patent & Utility Model Gazette DB, Patent Abstracts of Japan, (2011) (listed as document FP2 on the accompanying form PTO/SB/08A).

* cited by examiner

IC PACKAGE SACRIFICIAL STRUCTURES FOR CRACK PROPAGATION CONFINEMENT

CROSS REFERENCE TO RELATED APPLICATIONS

This application claims the benefit of U.S. Provisional Appl. No. 60/935,606, filed Aug. 21, 2007, which is incorporated by reference herein in its entirety.

BACKGROUND OF THE INVENTION

1. Field of the Invention

The present invention relates to IC packaging, and more particularly, to preventing damage from crack propagation.

2. Background of Invention

In forming integrated circuit (IC) packages, multiple units (e.g., substrates, IC die, etc.) are often formed simultaneously. Each of these units is then separated in a singulation process. However, units are often damaged in such a singulation process when stress is exerted on areas of the unit. In particular, cracks resulting from the exerted stress can render circuit traces, circuit connectors, electrical devices, IC components, and other features non-operational.

As the demand for increased throughput continues to rise, preventing cracks from damaging one or more units of a strip becomes important. Furthermore, as units become smaller, collections of units tend to become increasingly dense so that the likelihood that a crack will seriously damage one or more units increases.

Thus, what is needed is methods and systems for preventing damage from crack propagation.

SUMMARY OF THE INVENTION

Systems and methods for preventing damage to a unit with preventive structures are presented. In an embodiment, a unit of a collection of units includes a functional area and a preventive structure configured to prevent cracks from propagating into the functional area.

Further embodiments, features, and advantages of the invention, as well as the structure and operation of the various embodiments of the invention are described in detail below with reference to accompanying drawings.

BRIEF DESCRIPTION OF THE FIGURES

The present invention is described with reference to the accompanying drawings. In the drawings, like reference numbers indicate identical or functionally similar elements. The drawing in which an element first appears is indicated by the left-most digit in the corresponding reference number.

Figure 1:
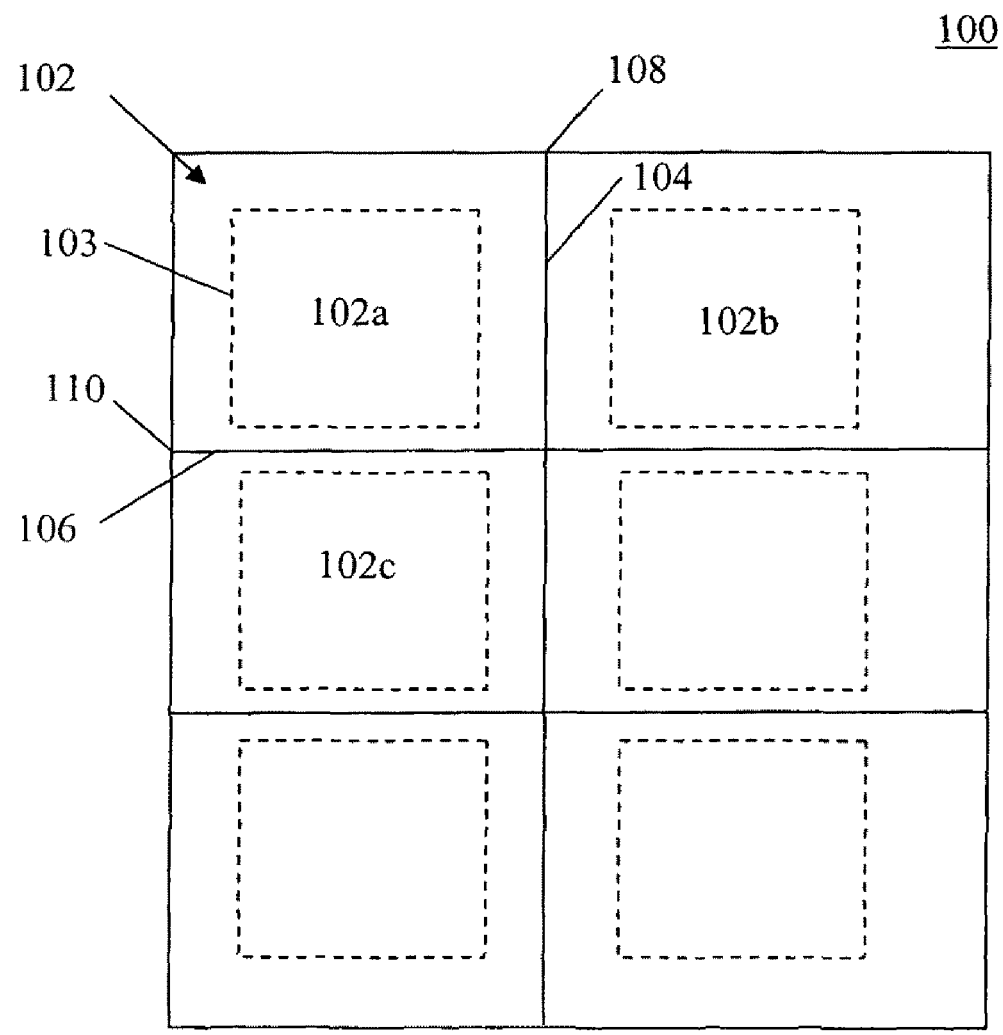
FIG. 1 shows a strip of units.

The present invention will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE INVENTION

While the present invention is described herein with reference to illustrative embodiments for particular applications, it should be understood that the invention is not limited thereto. Those skilled in the art with access to the teachings provided herein will recognize additional modifications, applications, and embodiments within the scope thereof and additional fields in which the invention would be of significant utility.

Introduction

FIG. 1 shows a strip of units 100 that includes a plurality of units 102. Plurality of units 102 may include substrates, integrated circuit (IC) packages, and/or other types of electrical devices. In other embodiments, strip 100 may be a wafer or a portion of a wafer than includes a collection of IC semiconductor die. In order for a unit 102a of plurality of units 102 to be used for its intended purpose, it must be separated from strip 100 in a singulation process. For example, unit 102a may be a substrate to be used in a plastic ball grid array (PBGA) package or other circuit package. Once unit 102a is separated from strip 100, unit 102a may be combined with an IC die, solder balls, and other appropriate aspects to form the desired PBGA package.

Unit 102a may be singulated in a variety of ways. For example, methods for unit singulation may include sawing, punching, abrasive particle cutting, and focused laser beam ablation cutting. All of the above mentioned methods involve stress being applied to unit 102a and/or adjacent units 102b and 102c. In an embodiment, stress from a singulation process is present along boundaries 104 and 106. For example, unit 102a may be singulated by sawing along boundaries 104 and 106 or applying a force on the top of unit 102a in a punching action.

As shown in FIG. 1, unit 102a has a functional area 103. Functional area 103 may contain circuit traces, connectors, circuit elements, IC features, and/or other features that are important to the operation of unit 102a. Thus, functional area 103 should be protected from cracks.

As unit 102a is singulated, areas of unit 102a, as well as other areas of strip 100, experience stress. This stress often leads to a release of energy in the form of a crack. As cracks propagate, they may cause damage to areas within functional area 103 and render unit 102a damaged or non-functional.

To reduce the damage caused by cracks, a number of approaches have been developed. For example, boundaries 104 and 106 may be scored. In such an embodiment, areas immediately surrounding boundaries 104 and 106 are weakened to prepare for a singulation process. Scoring may involve removing material and/or partially cutting along boundary 104 and/or boundary 106. Additionally or alternatively, boundaries 104 and 106 may be scored with a laser beam. In such an embodiment boundaries 104 and 106 are ablated or melted by the laser beam and then re-solidify into a more planar profile, thereby reducing areas of stress concentration along boundaries 104 and 106 that contribute to cracking and chipping during singulation.

Figure 2:
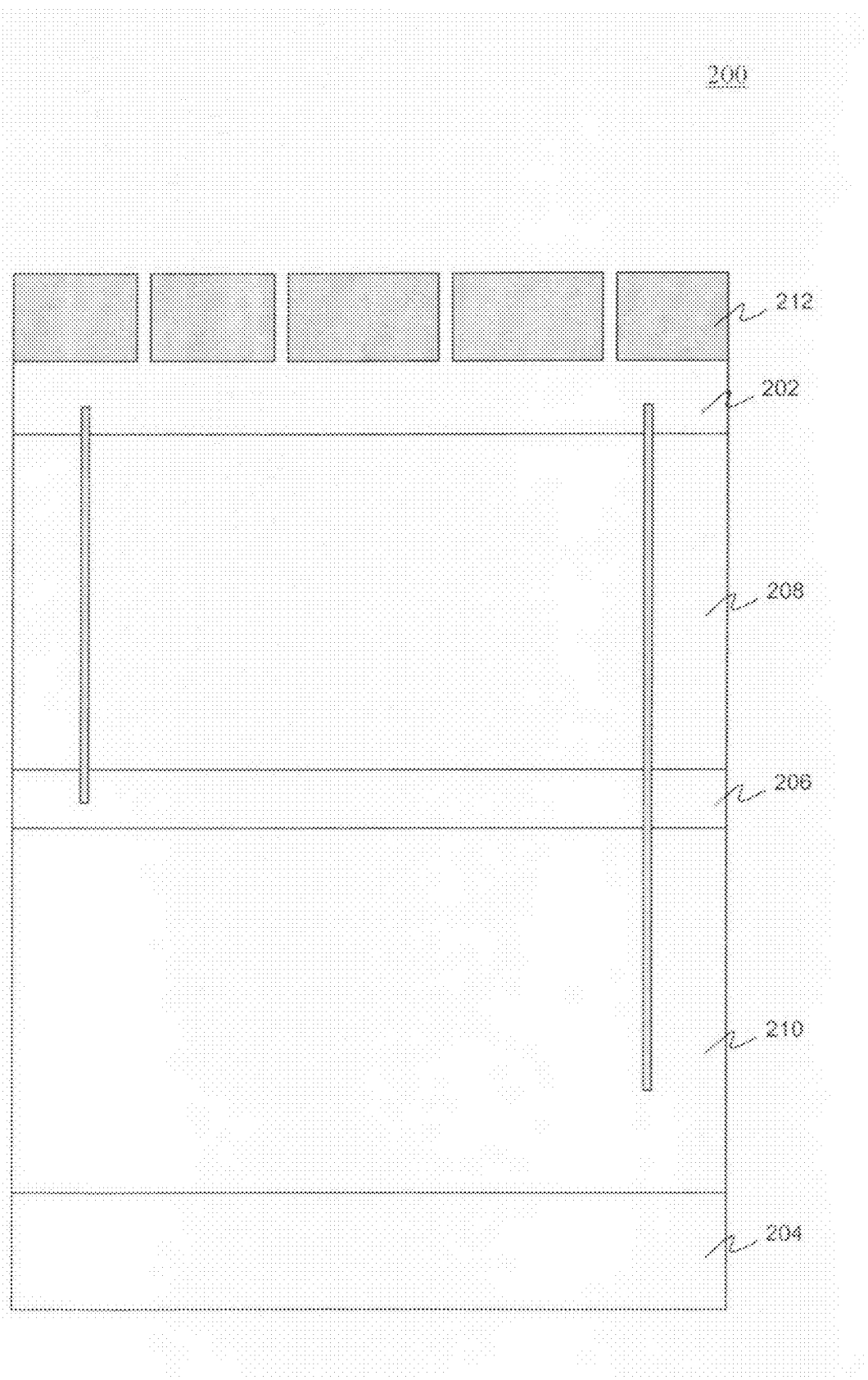
FIG. 2 shows a cross-sectional view of an exemplary unit.

FIG. 2 shows a cross-sectional view of an exemplary unit 200. Unit 200 is presented by way of example is not meant to limit the definition of a unit, as described herein. Unit 200 may be included in a strip of units similar to strip 100, as described with reference to FIG. 1. Unit 200 includes a signal layer 202 and a power layer 204 that sandwich a ground plane 206. Signal layer 202 may be patterned to form electrical traces and connectors. Ground plane 206 is insulated from signal layer 202 by a prepreg layer 208. Prepreg layer 208 comprises a fiber or an epoxy material with a high dielectric constant and toughness. Ground plane 206 is insulated from power layer 204 by a layer of BT-epoxy or FR-4 210. Layer 210 may also be formed out of other suitable printed circuit board (PCB) composites. PCB composites exhibit constant, high dielectric constants, and are nearly lossless, even at higher frequencies.

IC package stack signal layer 202 is sealed and protected from exposure by solder mask 212. Solder mask 212 is etched to allow access to functional elements (e.g., circuit traces, connectors, etc.) of signal layer 202.

Exemplary Embodiments

In embodiments described herein, techniques for limiting damage from crack propagation are presented. As would be appreciated by those skilled in the relevant art(s), a crack typically will propagate along the weakest segment under stress. Without any structure to prevent or mitigate crack propagation, cracks may propagate into functional areas of a unit and potentially cut through electrical traces, sever vias, or crack, chip, peel, or delaminate substrate layers. Damage to the unit incurred during a singulation process can be reduced using the techniques and embodiments presented herein.

Preventive structures may be formed on a unit to prevent cracks from propagating into functional areas of the unit. The preventive structures may be formed in areas of the unit that will be exposed to stress as the unit is singulated.

Through the use of preventive structures, areas of a unit may be strengthened. Strengthened portions absorb and/or reflect cracking energy so that cracks will not propagate into functional areas of the unit. Alternatively, areas of the unit may be weakened. As described above, cracks tend to propagate along weak areas. By weakening an area away from the functional areas of the unit, cracks may be confined to such an area and avoid the functional areas. Preventive structures may include structures that both weaken given areas of a unit and strengthen other areas of a unit.

Figure 3A:
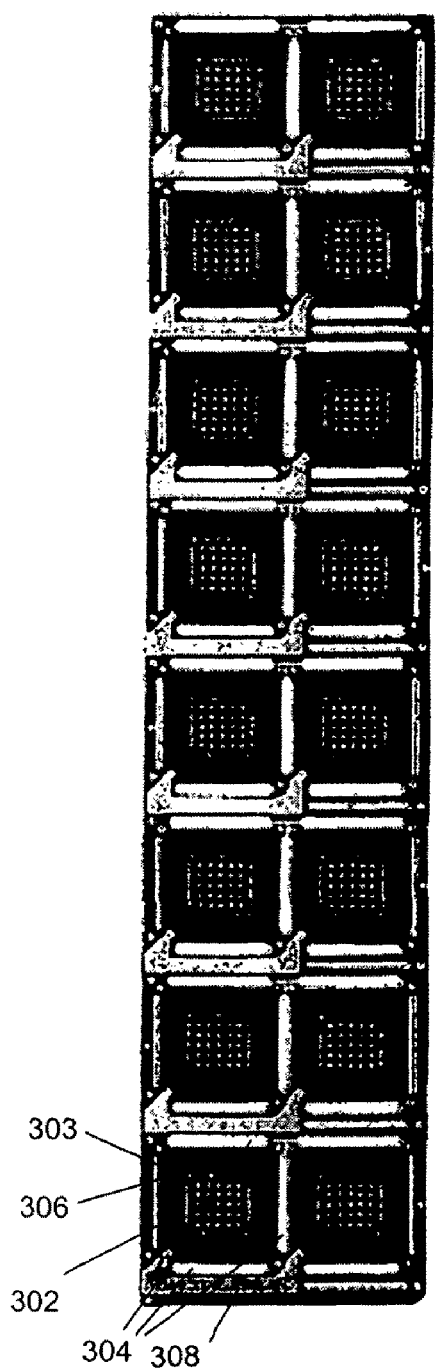
FIGS. 3A and 3B shows top and bottom views, respectively, of a strip of units, according to an embodiment of the present invention.
Figure 3B:
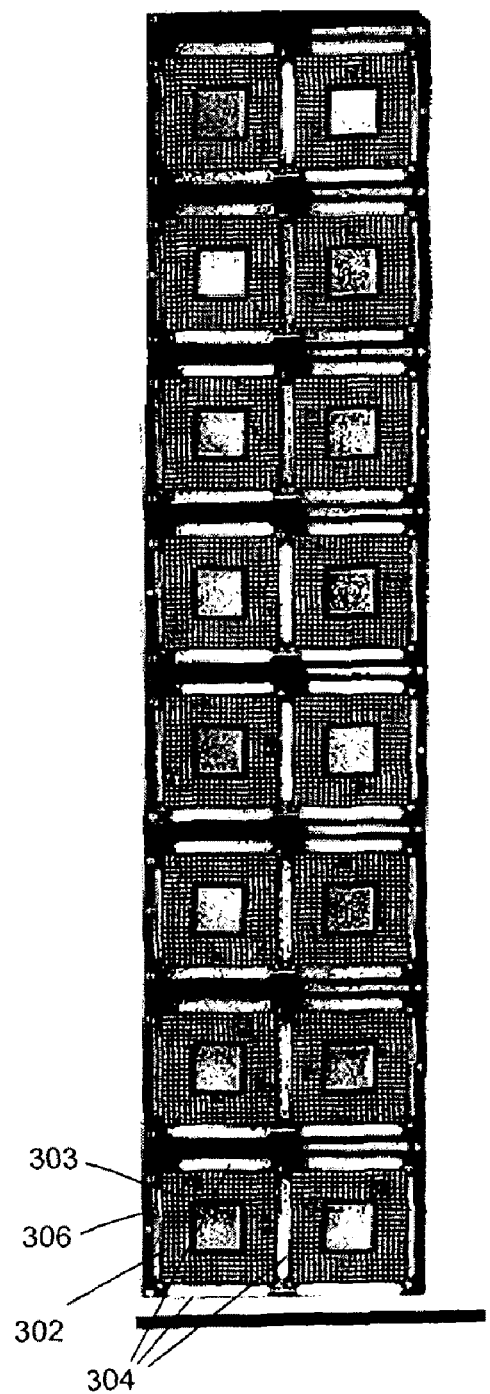

FIGS. 3A and 3B show top and bottom views of a strip of units 300, respectively, according to an embodiment of the present invention. Strip 300 includes a unit 302. Unit 302 includes a functional area 303 and slots 304 and 306. Similar to functional area 103 described reference to FIG. 1 above, functional area 303 may include functional features and elements of unit 302. For example, functional area 303 may include an area for an IC die or contact pads so that solder balls, pins, etc. may be attached.

Slots 304 and 306 are preventive structures that are configured to prevent cracks from propagating into functional area 303. In an embodiment, slots 304 and 306 weaken areas of unit 302 that will experience stress during a singulation process (e.g., along the boundaries of unit 302 with neighboring units). Cracks that may develop as a result of a singulation process may be confined to slots 304 and 306, and thus be prevented from propagating into functional area 303.

Slots 304 generally have a larger width than slot 306 because slot 306 is located along an edge portion of strip 300 (i.e., does not border any other unit) in which space is limited. In alternate embodiments, slot 306 may have a width substantially similar to or larger than slots 304.

Slots 304 and 306 may be formed partially or completely through unit 302. In other words, slots 304 and 306 may be areas of unit 302 where material is completely removed (i.e., a hole) or where material is partially removed.

FIG. 3A also shows unit 302 as having a mold top 308. In an embodiment, mold top 308 is configured to shape the mold or encapsulation material that will encapsulate a package (e.g., a PBGA package) that includes unit 302.

As shown in FIGS. 3A and 3B, slots 304 and 306 do not extend all the way along boundaries that separate units of strip 300. Slots that extend all way along boundaries 304 and 306 may reduce the structural integrity of strip 300. In embodiments described below, structures are described that provide additional ways to prevent cracks from propagating into functional areas. These structures may or may not be used along with slots, as described above.

Figure 4A:
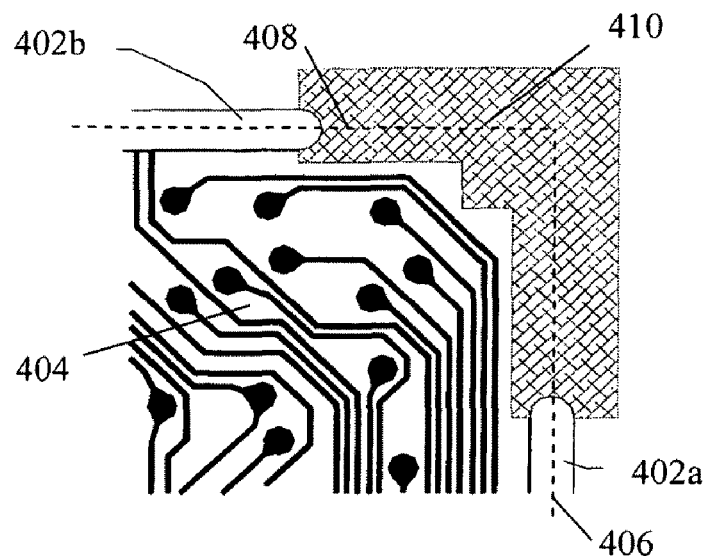
FIGS. 4A-4C show substrates including preventive structures, according to an embodiment of the present invention.
Figure 4B:
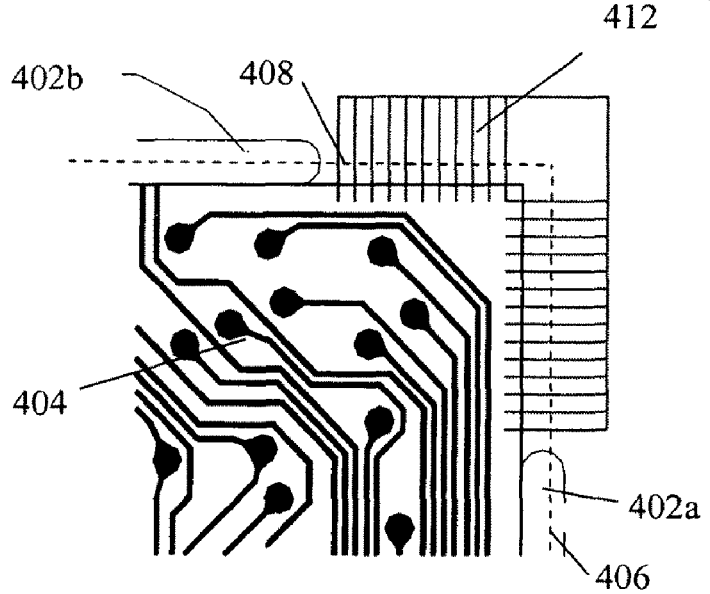
Figure 4C:
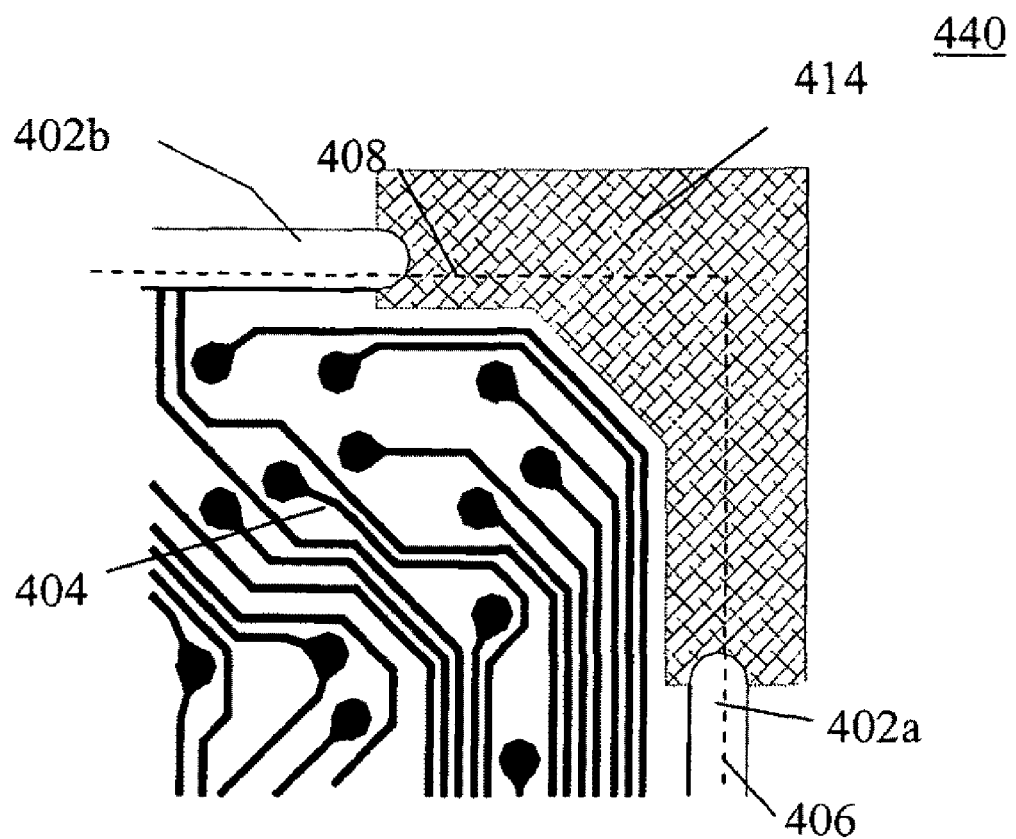

FIGS. 4A-4C show substrates 400, 420, and 440, respectively, according to embodiments of the present invention. In an embodiment, each of substrates 400, 420, and 440 are units in a strip of units similar to strip of units 100 described with reference to FIG. 1. Each of substrates 400, 420, and 440 includes slots 402a and 402b and a functional areas 404. Slots 402a and 402b are formed along boundaries 406 and 408, respectively, that separate the substrates from other units. Slots 402a and 402b may be generally similar to slot 304 and/or slots 306 as described with reference to FIG. 3, above. Each of substrates 400, 420, and 440 include a pattern that is configured to prevent cracks from propagating into functional areas 404. Although the patterns shown in FIGS. 4A-4C are shown to be formed on substrate, those skilled in the relevant arts would appreciate that the patterns shown may also be applied to other types of units.

A mesh 410 is formed on substrate 400 to strengthen substrate 410 along boundaries 406 and 408. Mesh 410 serves to confine cracks to areas within mesh 410 and to protect functional areas 404. For example, if a crack occurs as a result of stress along boundary 406, that crack may be confined by slots 402a and 402b and/or mesh 410, thereby protecting functional features 404. In particular, mesh 410 may be configured to absorb cracking energy, so as to prevent cracks from forming and/or propagating.

Similarly, lines 412 formed on substrate 420 and planes 414 formed on substrate 440, shown in FIGS. 4B and 4C, respectively, are formed to prevent cracks from propagating into functional areas 404. As shown in FIG. 4B, lines 412 include a plurality of horizontal and vertical lines formed on substrate 420. As shown in FIG. 4C, planes 414 include a plurality of planes formed on substrate 440. Mesh 410 and planes 414 are shown to be similar in FIGS. 4A and 4C respectively. However, mesh 410 may be made up lines that are broken at intersections while planes 414 may be made up of lines that are continuous at intersections.

As noted above, units often have multiple layers. A singulation process may result in stress being exerted on more than one layer of a unit. Accordingly, mesh 410, lines 412, and planes 414 may be formed on two or more layers of the substrate. In a further embodiment, patterns formed on different layers may be coupled together through the use of vias. Alternatively, the structures may remain isolated.

In an embodiment, different structures may be formed on different layers of a substrate. For example, a four layer substrate may have a mesh formed on a first layer, lines formed on a second layer and a third layer, and planes formed on a fourth layer.

One or more of mesh 410, lines 412, and planes 414 may be formed out of a metallic material (e.g., copper, copper alloy, gold, etc.). In a further embodiment in which functional areas 404 include circuit traces or other similar features, mesh 410, lines 412, and/or planes 414 may be formed out of the same material and have line widths comparable to features of functional area 404. In such an embodiment, mesh 410, lines 412, and/or planes 414 may be may be included in the layout of the respective substrate and be patterned onto a substrate during the same fabrication process in which features of functional area 404 are formed on the substrate.

Figure 5A:
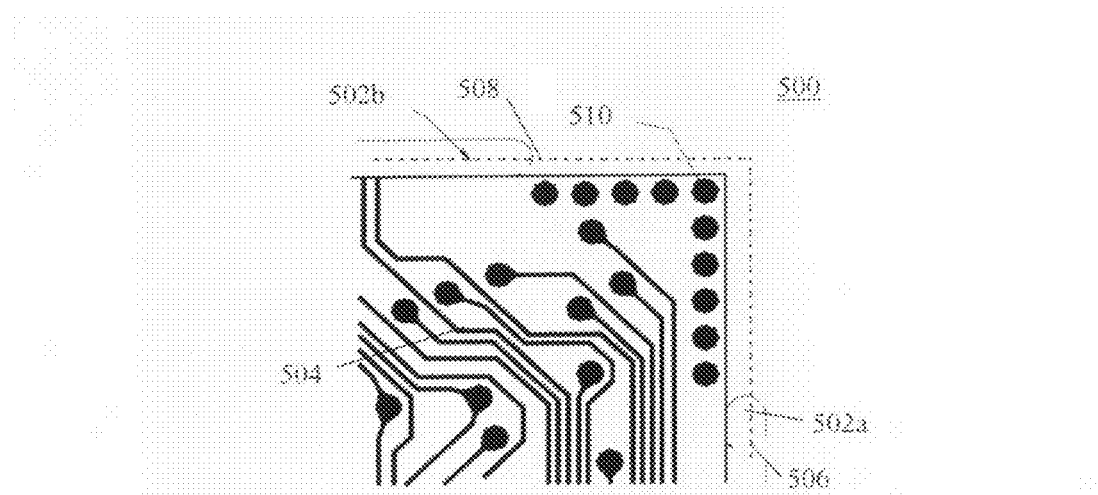
FIGS. 5A-5C shows substrates that include a plurality of vias, according to an embodiment of the present invention.

FIG. 5A shows a substrate 500 including preventive structures, according to an embodiment of the present invention. Substrate 500 includes slots 502*a* and 502*b*, a functional area 504, and a plurality of vias 510. Slots 502*a* and 502*b* are generally similar to slots 402*a* and 402*b*, described with reference to FIGS. 4A-4C above. Similar to functional area 404, described with reference to FIGS. 4A-4C, functional area 504 may include circuit traces, circuit connectors, electrical components, etc.

Substrate 500 includes a plurality of vias 510 formed along boundaries 506 and 508. Similar to boundaries 406 and 408 described with reference to FIGS. 4A-4C, boundaries 506 and 508 may separate substrate 500 from other units of a strip or collection of units and may be areas where stress from a singulation process is felt. As shown in FIG. 5, plurality of vias 510 effectively forms a fence that protects functional area 504 from cracks. In an embodiment, plurality of vias 510 may absorb and/or reflect cracking energy so as to prevent cracks from propagating into functional areas 504.

In an embodiment, substrate 500 may include multiple layers. In such an embodiment, vias of plurality of vias 510 may extend to some or all layers of the substrate. Vias of plurality of vias 510 may be plated and/or filled and may be metallic. For example, vias of plurality of vias 510 may include copper, a copper alloy, aluminum, etc.

In an embodiment, functional area 504 includes a via. In such an embodiment, vias of the plurality of vias 510 may be substantially similar, in terms of composition, size, etc., to the via of functional area 504. In such an embodiment, vias of plurality of vias 510 may be included in the layout of substrate 500 and may be and fabricated in the same process in which features of functional area 504 are fabricated.

As shown in FIG. 5A, plurality of vias 510 is formed as a combination of two lines of vias. However, in alternate embodiments, plurality of vias 510 may be arranged in other shapes without departing from the scope and spirit of the present invention.

Figure 5B:
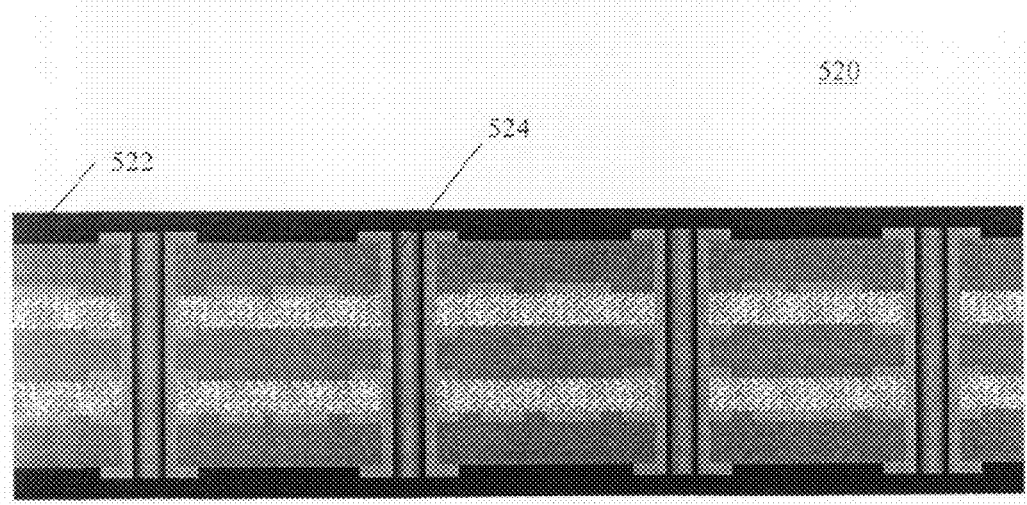
Figure 5C:
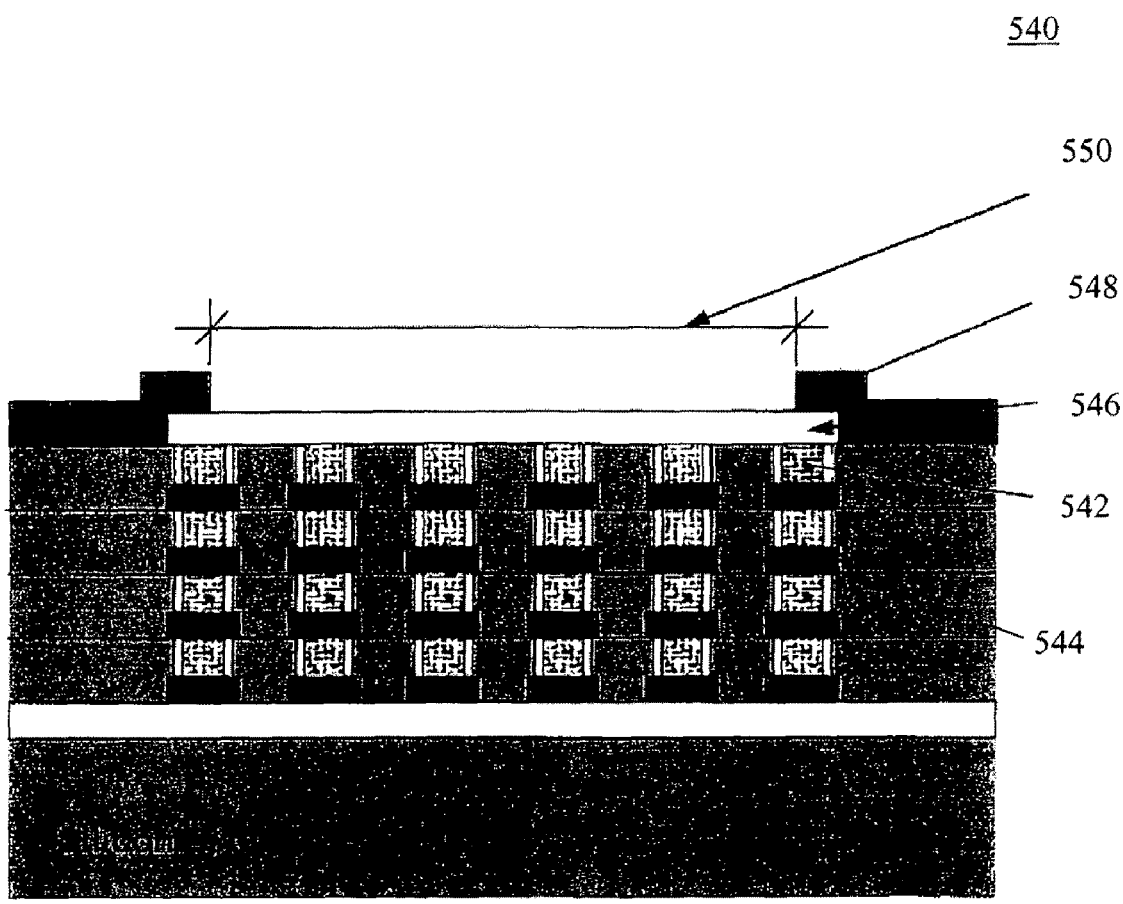

FIGS. 5B and 5C show other implementations of a preventive structure that includes a plurality of vias, according to embodiments of the present invention. FIG. 5B shows a substrate 520 that that is generally similar to substrate 500. However, substrate 520 additionally includes a solder mask 522 and a plurality of vias 524. As shown in FIG. 5B, vias of plurality of vias 524 do not penetrate solder mask 522. In an alternate embodiment, one or more vias of plurality of vias 524 may partially or completely penetrate solder mask 522. In an embodiment, vias of plurality of vias 524 are formed along an edge of substrate 520 (e.g., a boundary between substrate 520 and another unit in a strip or collection of units). Similar to plurality of vias 510 described with reference to FIG. 5A, plurality of vias 524 are configured to absorb and or reflect cracking energy so cracks do not propagate into functional areas.

FIG. 5C shows a substrate 540 that includes a plurality of vias 542, a plurality of slabs 544, a metal pad 546, a passivation 548, and a bond opening 550. As shown in FIG. 5C, substrate 540 includes a mesh formed by plurality of vias 542 and plurality of slabs 544. In an embodiment, slabs of plurality of slabs 544 may be made up of a metallic material (e.g., copper, copper alloy, aluminum) and may be similar in composition to plurality of vias 542. Thus, plurality of vias 542 and plurality of slabs 544 form mesh preventive structure that absorbs and/or reflects cracking energy. The mesh shown in FIG. 5C is different from mesh 410 described reference to FIG. 4A, above, in that the mesh of plurality of vias 542 and plurality of slabs 544 is a three dimensional structure that is formed through portions of substrate 540. Passivation 548 may be configured to isolate elements of substrate 540 (e.g., metal pad 546) from other elements of substrate 540.

Figure 6A:
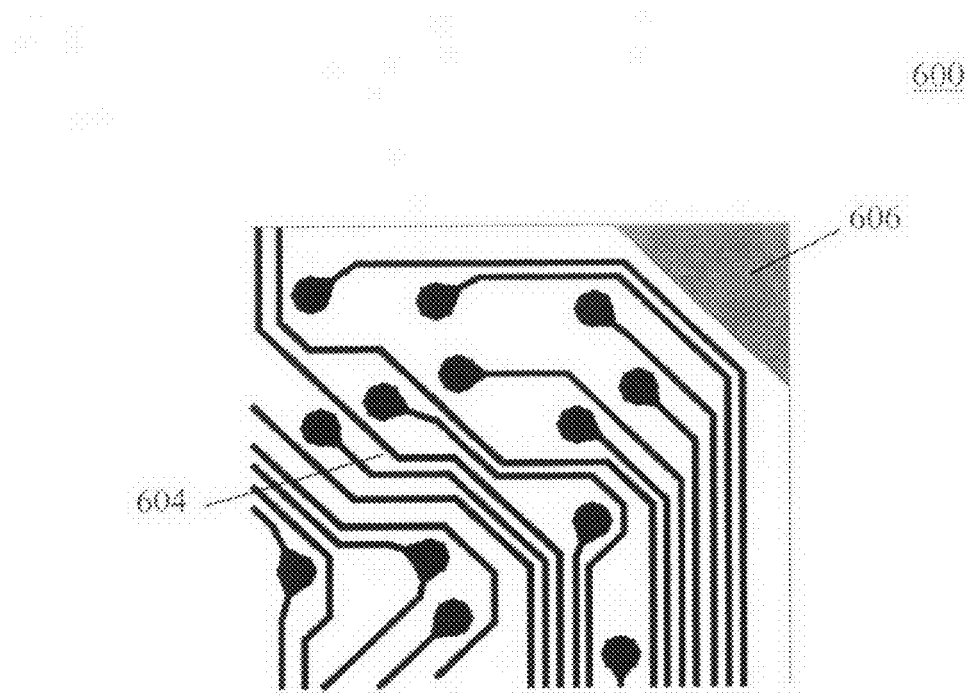
FIGS. 6A-6C shows substrates that include exposed regions, according to an embodiment of the present invention.
Figure 6B:
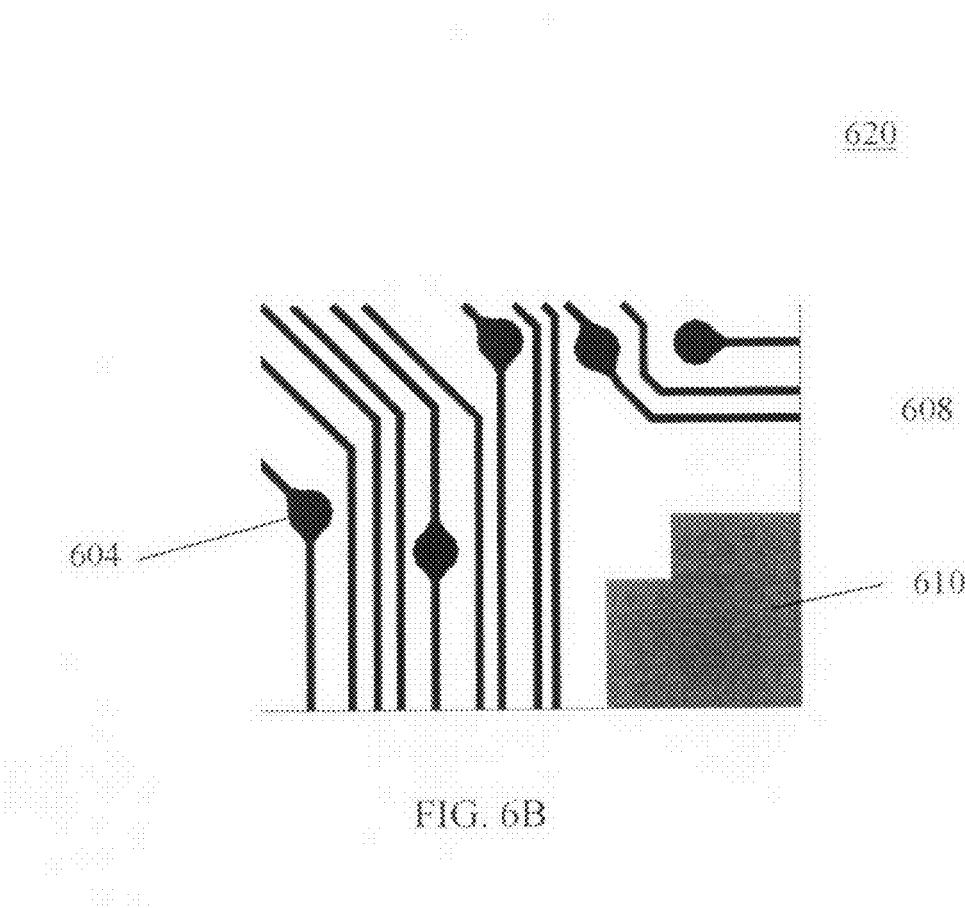
Figure 6C:
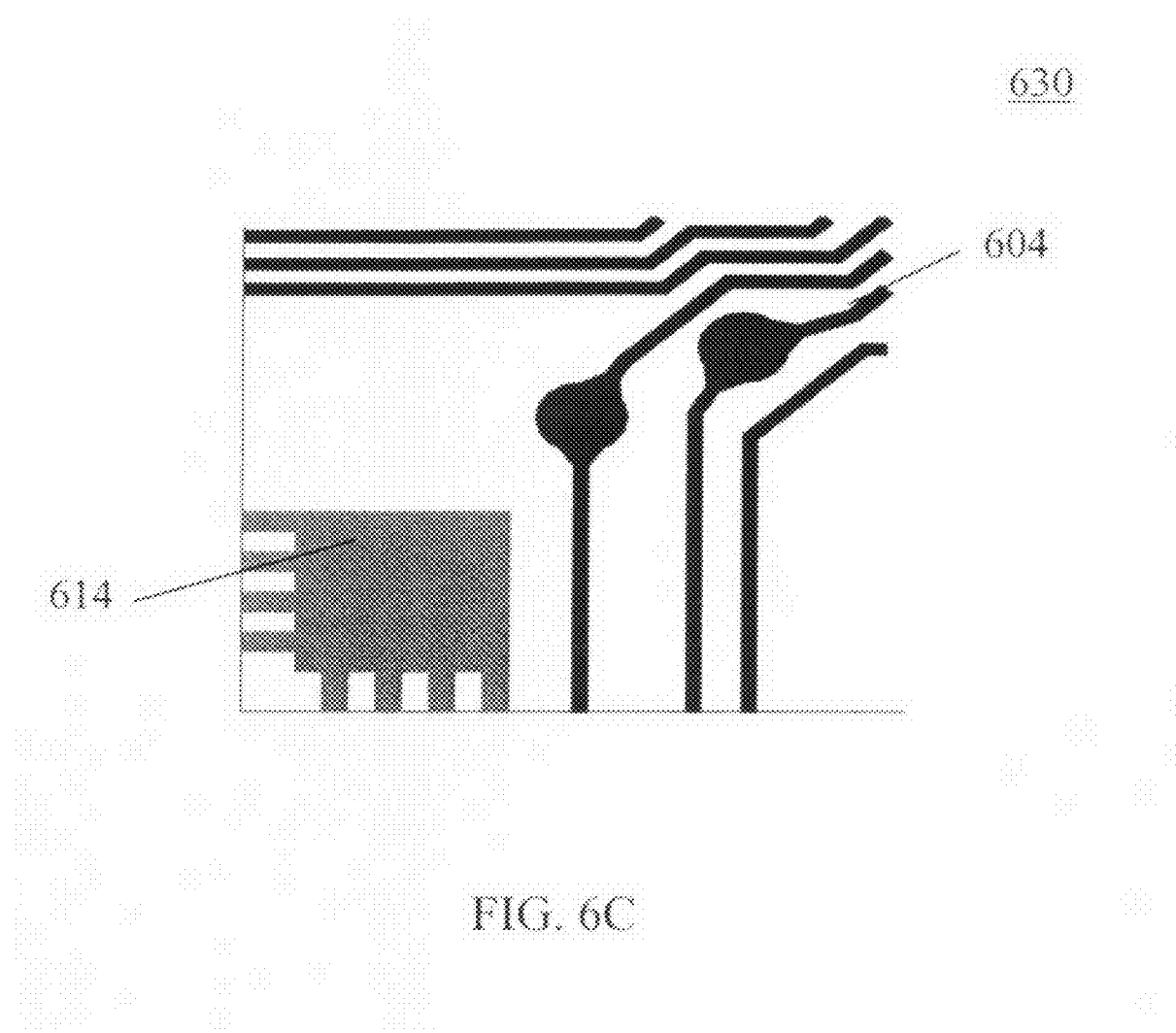

FIGS. 6A-6C show substrates 600, 620, and 630 that include exposed plated regions 606, 610, and 614, respectively, according to embodiments of the present invention. Substrate 600 includes a functional area 604 generally similar to functional area 404 described with reference to FIG. 4, above, and exposed region 606 formed along an edge portion of substrate 600. In an embodiment, substrate 600 is covered with a solder mask. The solder mask may be used to identify regions of substrate 600 where solder should be deposited. In a further embodiment, the solder mask is substantially rigid. In such an embodiment, cracks resulting from stress exerted in a singulation process may tend to peel or tear the solder mask. Such peeling or tearing may inflict damage to features of functional area 604. Thus, in addition to preventing cracks from propagating into functional area 604, exposed region 606 may also be configured to prevent tears or peels from propagating into functional area 604.

Exposed plated regions 606, 610, and 614 may be areas where the solder mask is not present. Instead, exposed plated regions 606, 610, and 614 may be areas where substrate 600 is plated with a material.

Exposed plated areas 606, 610, and 614 may be formed out of a metallic material, such as copper, a copper alloy, aluminum, etc. In another embodiment, exposed regions may be plated with a corrosive resistant material such as gold, silver, etc.

As shown in FIG. 6A, exposed region 604 is formed in a substantially triangular shape in a corner portion of substrate 600. However, an exposed plated region may be formed in other shapes. For example, FIGS. 6B and 6C show exposed plated regions 610 and 614 formed along edge portions 608 and 610, respectively. Exposed plated region 610 is formed in a substantially rectangular form and has a notch formed therein. Exposed plated region 614 is includes a substantially rectangular portion that a plurality of lines. As would be apparent to those skilled the relevant art(s), exposed plated regions may have other shapes without departing from the scope and spirit of the present invention. Although not shown in FIGS. 6A-6C, exposed plated regions may also be combined with slots, as described above, to prevent damage to features of functional area 604.

Figure 7:
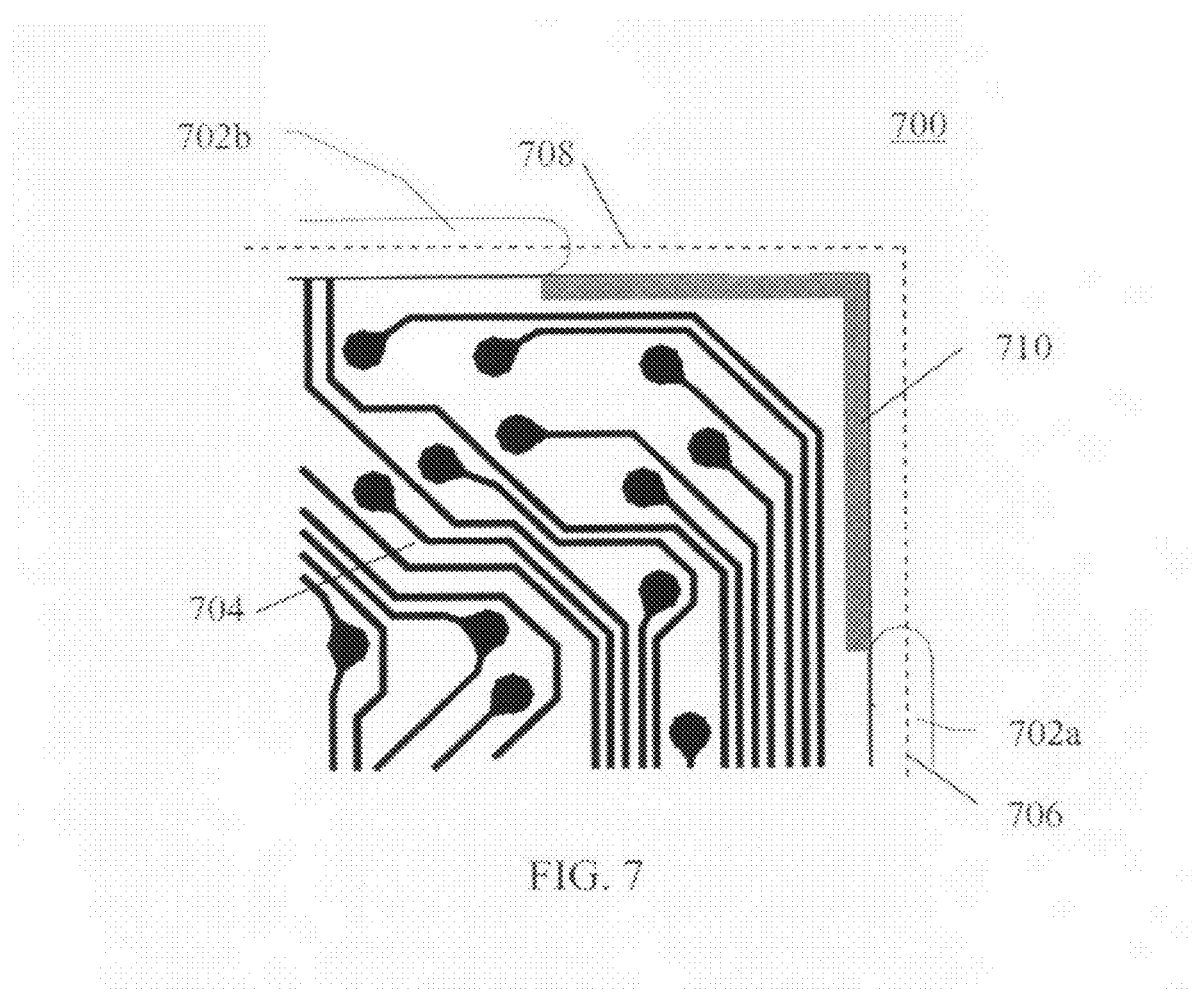
FIG. 7 shows a substrate that includes a solder mask slot, according to an embodiment of the present invention.

FIG. 7 shows a substrate 700 that includes slots 702*a* and 702*b*, a functional area 704, and a solder mask slot 710, according to embodiment of the present invention. In an embodiment, slots 702*a* and 702*b*, formed along boundaries 706 and 708, respectively, are substantially similar to slots 402*a* and 402*b*, respectively, described with reference to FIGS. 4A-4C above. Functional area 704 may include features similar to functional area 404, described with reference to FIG. 4, above.

In an embodiment, slot 710 is configured to prevent cracks from propagating into functional area 704. In a further embodiment, solder mask slot 710 may only be formed in a solder mask of substrate 700. In such an embodiment, solder mask slot 710 may also be configured to prevent peeling and/or tearing of the solder mask.

Solder mask slot 710 weakens the solder mask in areas that may be exposed to stress during a singulation process. In such a way, a cracking energy may be confined by solder mask slot 710 and, thus prevented from causes tearing or peeling of the solder mask in functional areas 704. Upon reaching solder mask slot 710 a peel or crack will tend to move along solder mask slot 710 since it offers less resistance than the solder mask in other areas. Thus, the peel or crack would be confined in an area away from functional area 704.

As shown in FIG. 7, solder mask slot 710 is formed along edge portions of substrate 700. However, as would be apparent to those skilled in the relevant art(s), solder mask slot 710 may be formed in different shapes without departing from the scope and spirit of the present invention.

Figure 8A:
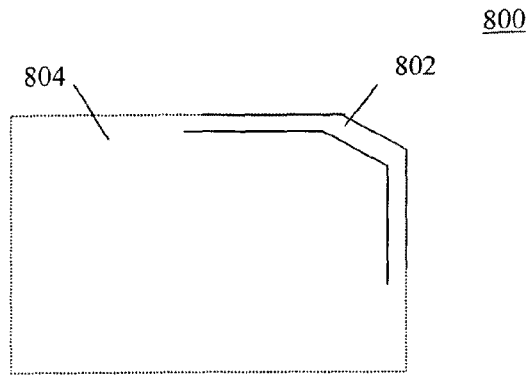
FIGS. 8A and 8B show aspects of a wafer, according to an embodiment of the present invention.
Figure 8B:
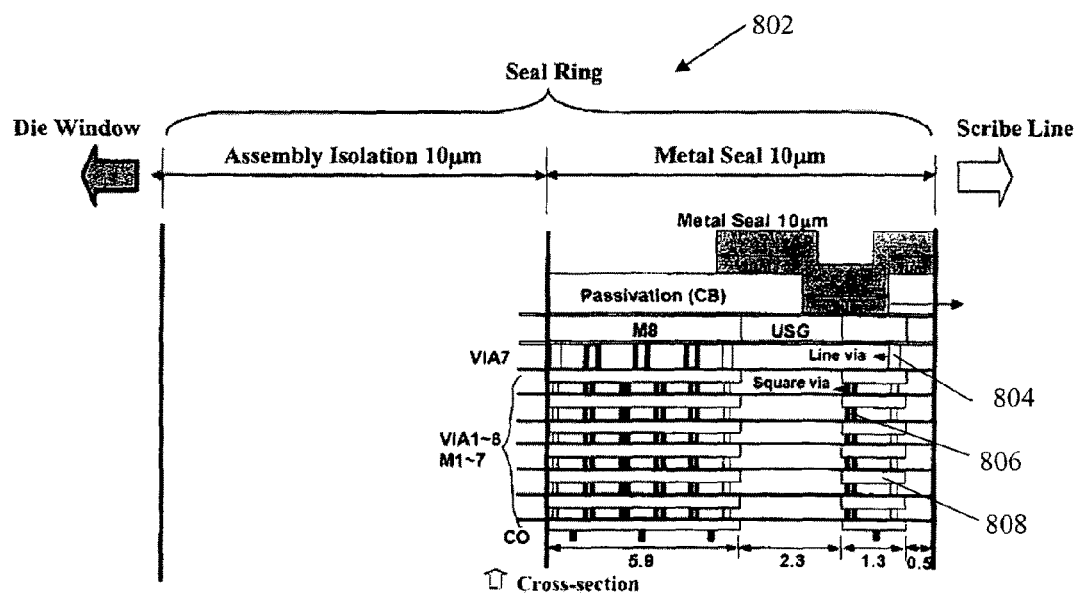

FIGS. 8A and 8B show top and cross-sectional views of aspects of a wafer, according to an embodiment of the present invention. As shown in FIG. 8A, an IC die 800, which includes a functional area 804, is at least partially surrounded by a seal ring 802. Functional area 804 may include integrated circuit transistors, resistors, and/or other types of electrical or logic components that may be included in an IC die or other semiconductor device. Seal ring 802 is configured to prevent cracks from propagating into functional area 804.

FIG. 8B shows a cross-sectional view of seal ring 802 of IC die 800. Seal ring 802 includes line vias 804 and square vias 806. Line vias 804 and square vias 806 is configured to absorb and/or reflect crack energy so that cracks do not propagate into functional area 804. Furthermore, seal ring 802 also includes slabs 808. Slabs 808 may be formed horizontally (whereas vias are formed vertically) to create a three dimensional mesh. Slabs 808 may be similar to line vias and/or square vias 806 in composition. In alternate embodiments, seal ring 802 may include any other combination of line vias 804, square vias 806, and slabs 808.

Figure 9:
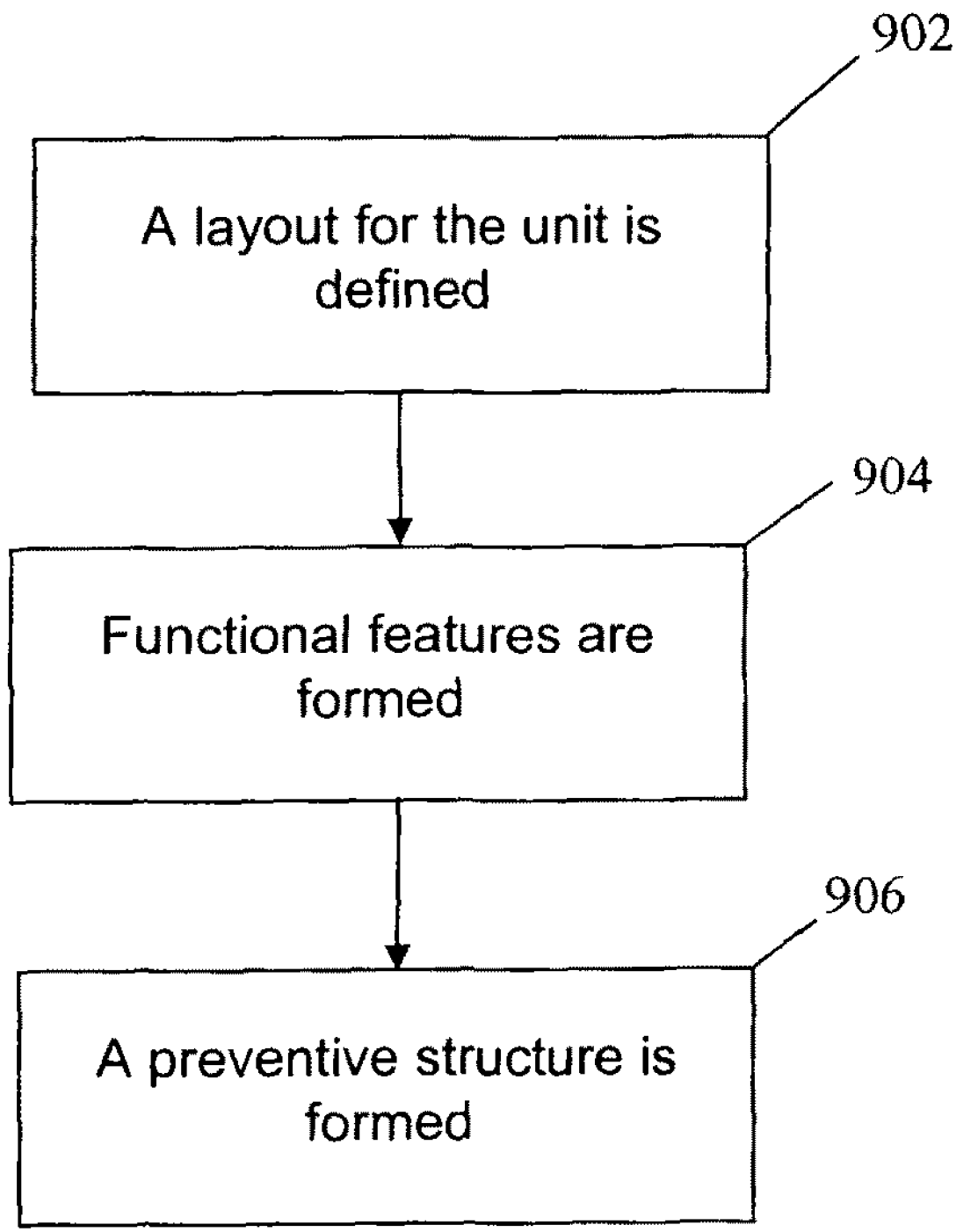
FIG. 9 shows a flowchart providing example steps for forming a unit, according to an embodiment of the present invention.

FIG. 9 shows flowchart 900 providing example steps for forming a unit, according to an embodiment of the present invention. Other structural and operational embodiments will be apparent to persons skilled in the relevant art(s) based on the following discussion. The steps shown in FIG. 9 do not necessarily have to occur in the order shown. The steps of FIG. 9 are described in detail below.

Flowchart 900 begins in step 902. In step 902, a layout for the unit is defined. For example, in the embodiment in which the unit is a substrate, a layout including circuit traces and circuit connectors may be defined. Alternatively, in the embodiment in which the unit is an IC die, IC elements such as resistors and transistors may be defined.

In an embodiment, a layout for a preventive structure that is configured prevent cracks from propagating into functional areas of the unit may also be defined along with the layout for the functional features. In such an embodiment, step 902 may include laying out functional features and laying out the preventive structure.

In step 904, functional features are formed. For example, functional features such as circuit traces, IC elements, or other features may be formed in functional areas of the unit.

In step 906, preventive structures are formed. For example, one or more of slots, lines, meshes, planes, seal rings or other structures, as described above, may be formed on the unit. In an embodiment, steps 904 and 906 may be completed during the same step of a fabrication process. Fabricating the functional features and the preventive structures during the same step may reduce the cost associated with forming the preventive structures.

CONCLUSION

Exemplary embodiments of the present invention have been presented. The invention is not limited to these examples. These examples are presented herein for purposes of illustration, and not limitation. Alternatives (including equivalents, extensions, variations, deviations, etc., of those described herein) will be apparent to persons skilled in the relevant art(s) based on the teachings contained herein. Such alternatives fall within the scope and spirit of the invention.

What is claimed is:

1. A unit of a collection of units, comprising:
   a functional area; and
   a preventive structure, wherein a singulation boundary between the unit and another unit of the collection units passes through the preventive structure, and wherein the preventive structure is configured to prevent cracks from propagating into the functional area when the unit is singulated along the singulation boundary.

2. The unit of claim 1, wherein the preventive structure is formed in an area of the unit that is exposed to stress during a singulation process.

3. The unit of claim 1, wherein the preventive structure comprises a pattern formed on a surface of the unit.

4. The unit of claim 1, wherein the preventive structure includes a pattern selected from the group consisting of a mesh, a plurality of lines, and a plurality of planes.

5. The unit of claim 1, wherein the preventive structure comprises a metallic material.

6. The unit of claim 3, wherein the unit includes a plurality of layers, wherein the surface is a surface of a first layer, wherein the preventive structure further comprises a second pattern formed on a surface of a second layer.

7. The unit of claim 6, wherein the preventive structure further comprises a via, wherein the via couples the pattern formed on the surface of the first layer to the pattern formed on the surface of the second layer.

8. The unit of claim 3, wherein the functional area includes a circuit trace, wherein the pattern includes an element substantially similar to the circuit trace.

9. The unit of claim 1, wherein the preventive structure includes a plurality of vias.

10. The unit of claim 9, wherein a via of the plurality of vias is at least one of a plated via or a filled via.

11. The unit of claim 9, wherein a via of the plurality of vias comprises a metal.

12. The unit of claim 9, wherein the functional area includes a via, wherein a via of the plurality of vias is substantially similar to the via of the functional area.

13. The unit of claim 9, wherein vias of the plurality of vias are located along one or more boundaries of the unit with another unit of the collection of units.

14. The unit of claim 9, wherein the plurality of vias are arranged so as to absorb or reflect cracking energy.

15. The unit of claim 9, wherein the preventive structure further comprises a plurality of horizontal slabs.

16. The unit of claim 1, wherein the preventive structure includes an exposed plated region.

17. The unit of claim 16, wherein the exposed plated region is configured to prevent tearing of a solder mask of the unit.

18. The unit of claim 16, wherein the exposed plated region comprises a metal.

19. The unit of claim 16, wherein the exposed plated region comprises a corrosive-resistant material.

20. The unit of claim 16, wherein the exposed plated region includes at least one of a substantially rectangular area or a substantially triangular area.

21. The unit of claim 1, wherein the preventive structure includes a slot in a solder mask of the unit.

22. The unit of claim 21, wherein the slot is configured to confine a peel or tear to an area away from the functional area.

23. The unit of claim 21, wherein the slot is formed in a corner portion of the unit.

24. The unit of claim 1, wherein the unit is a substrate.

25. The unit of claim 1, wherein the preventive structure is configured to strengthen a portion of the unit.

26. The unit of claim 25, wherein the preventive structure is configured to reflect or absorb cracking energy.

27. The unit of claim 1, wherein the preventive structure is configured to weaken a portion of the unit.

28. The unit of claim 27, wherein the preventive structure is configured to confine a crack.

29. The unit of claim 1, wherein the preventive structure includes a slot.

30. The unit of claim 29, wherein the slot is located substantially close to the singulation boundary.

31. The unit of claim 1, wherein the unit is an IC die and the collection of units is a wafer.

32. The unit of claim 1, wherein the preventive structure comprises:
    a first structure configured to weaken a first portion of the unit; and
    a second structure configured to strengthen a second portion of the unit.

* * * * *